United States Patent
Chen et al.

(10) Patent No.: US 10,847,211 B2
(45) Date of Patent: Nov. 24, 2020

(54) LATCH CIRCUITRY FOR MEMORY APPLICATIONS

(71) Applicant: Arm Limited, Cambridge (GB)

(72) Inventors: Andy Wangkun Chen, Austin, TX (US); Teresa Louise McLaurin, Dripping Springs, TX (US); Frank David Frederick, Austin, TX (US); Richard Slobodnik, Austin, TX (US); Yew Keong Chong, Austin, TX (US)

(73) Assignee: Arm Limited, Cambridge (GB)

( * ) Notice: Subject to any disclaimer, the term of this patent is extended or adjusted under 35 U.S.C. 154(b) by 140 days.

(21) Appl. No.: 15/956,724

(22) Filed: Apr. 18, 2018

(65) Prior Publication Data

US 2019/0325947 A1    Oct. 24, 2019

(51) Int. Cl.
  *G11C 11/00*   (2006.01)
  *G11C 11/419*  (2006.01)
  *G11C 7/22*    (2006.01)
  *H03K 19/1776* (2020.01)
  *G11C 7/10*    (2006.01)

(52) U.S. Cl.
  CPC ............ *G11C 11/419* (2013.01); *G11C 7/106* (2013.01); *G11C 7/1087* (2013.01); *G11C 7/22* (2013.01); *H03K 19/1776* (2013.01)

(58) Field of Classification Search
  CPC ..... G11C 11/419; G11C 7/106; G11C 7/1087; G11C 7/22
  See application file for complete search history.

(56) References Cited

U.S. PATENT DOCUMENTS

| | | | | |
|---|---|---|---|---|
| 8,441,279 B2* | 5/2013 | Lee | ...................... | H03K 19/003 326/16 |
| 8,484,278 B2* | 7/2013 | Ray | ...................... | G06F 17/141 708/405 |
| 8,516,316 B2* | 8/2013 | Lam | ............... | G01R 31/318541 714/726 |
| 8,604,745 B2* | 12/2013 | Villwock | ............... | G01R 31/34 318/148 |
| 9,121,892 B2* | 9/2015 | Lamb | ............. | G01R 31/318555 |
| 9,362,837 B2* | 6/2016 | Diedrichs | ............... | H02M 5/40 |
| 9,383,766 B2* | 7/2016 | Charlebois | ............... | G06F 1/08 |
| 9,746,519 B2* | 8/2017 | Pugliesi-Conti | ............................ | G01R 31/318588 |
| 2009/0300448 A1* | 12/2009 | Tomita | ........... | G01R 31/318541 714/731 |
| 2011/0066906 A1* | 3/2011 | Tang | ................. | G01R 31/31858 714/731 |

* cited by examiner

*Primary Examiner* — Esaw T Abraham
(74) *Attorney, Agent, or Firm* — Pramudji Law Group PLLC; Ari Pramudji (57) ABSTRACT

Various implementations described herein are directed to an integrated circuit having first latch circuitry with multiple first latches that latch multiple input data signals. The integrated circuit may include second latch circuitry having a single second latch that receives the latched multiple input data signals from the multiple first latches and outputs a single latched data signal based on the latched multiple input data signals. The integrated circuit may include intermediate logic circuitry that is coupled between the first latch circuitry and the second latch circuitry. The intermediate logic circuitry may receive and combine the multiple input data signals from the first latch circuitry into a single data signal that is provided to the single second latch of the second latch circuitry for output as the single latched data signal.

18 Claims, 4 Drawing Sheets

LATCH CIRCUITRY FOR MEMORY APPLICATIONS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional semiconductor fabrication designs, embedded scan chains may include scan chains where write data-in, write enable, and read data-out include full scan flip-flops. These embedded scan chains may be used for asynchronous clock design where data (D) and write enable (WEN) capture uses write-clock (WCLK) and Q-out uses read-clock (RCLK). These many signals and associated circuitry may cause a large area footprint on circuit architecture. A redesign of scan chains may therefore be needed to reduce area of integrated circuitry.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to latch circuitry for memory applications for various scan chain applications. Some implementations described herein are directed to design-for-test (DFT) scan designs, schemes and techniques for various integrate circuit (IC) memory applications. The various schemes and techniques described herein enable area efficient memory design with an embedded full scan chain by reducing a number of scan-shift chains, e.g., in an input/output (I/O) column multiplexer (colmux). For instance, in reference to single port memory, two (2) scan chains (e.g., D and WEN) are reduced to one (1) scan chain, and in reference to dual port memory, three (3) scan chains (e.g., D, WEN and READ) are reduced to one (1) scan chain. The various schemes and techniques described herein further address flop count reductions by unifying scan chains in the presence of asynchronous read and write clock domains and by reducing observability latches of control inputs.

Various implementations of latch circuitry for memory applications with an embedded full scan chain will now be described in detail herein with reference to FIGS. 1-4.

Figure 1:
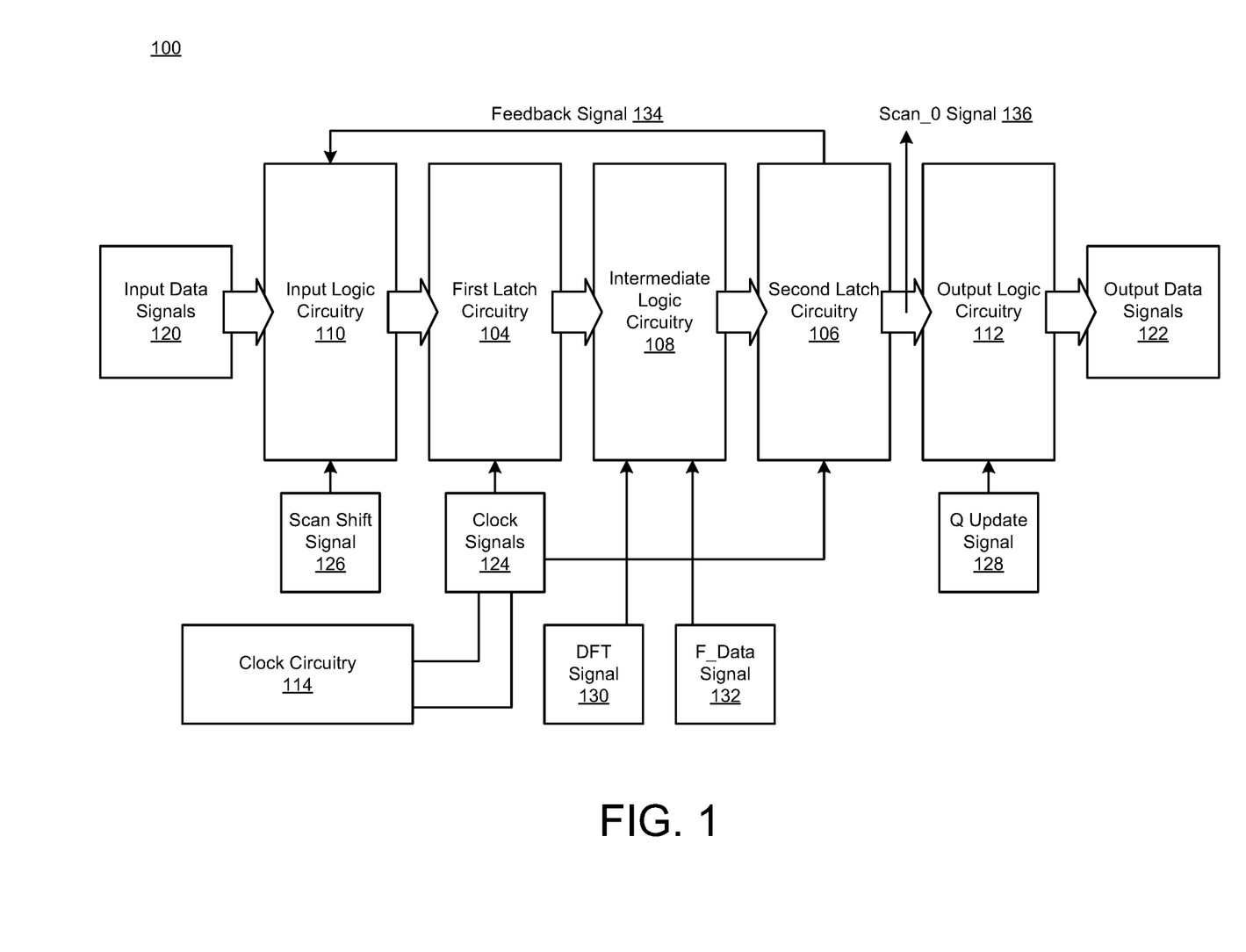
FIG. 1 illustrates a diagram of latch circuitry for memory applications in accordance with various implementations described herein.

FIG. 1 illustrates a block diagram of memory circuitry 100 in accordance with various implementations described herein. As shown, the memory circuitry 100 may include multiple components, such as, e.g., first latch circuitry 104, intermediate logic circuitry 108, and second latch circuitry 106. Further, the memory circuitry 100 may also include input logic circuitry 110 and output logic circuitry 112. In addition, the memory circuitry 100 may utilize clock circuitry 114. In various implementations, these components 104, 106, 108, 110, 112, 114 may be coupled together to interface with each other and operate collectively to provide area efficient memory functionality for the circuitry 100 in various scan chain applications, as described herein. The area efficient memory circuitry 100 may be referred to simply as memory circuitry and/or a memory circuit, and the memory circuitry 100 may be implemented with static random access memory (SRAM) having a scan chain.

As shown in FIG. 1, the input logic circuitry 110 may receive multiple input data signals 120 (e.g., more than one, or two or more) and provide the multiple input data signals 120 to the first latch circuitry 104. The first latch circuitry 104 may receive the multiple input data signals 120 from the input logic circuitry 110 and latch the multiple input data signals 120. Also, as shown, the intermediate logic circuitry 108 may be coupled between the first latch circuitry 104 and the second latch circuitry 106. In some instances, the intermediate logic circuitry 108 may receive and combine the multiple input data signals 120 from the first latch circuitry 108 into a single data signal that is provided to the second latch circuitry 106 for output as a single latched data signal. Also, as shown, the second latch circuitry 106 may receive the latched multiple input data signals from the first latch circuitry 104 via the intermediate logic circuitry 108, and then the second latch circuitry 106 may output the single latched data signal based on the latched multiple input data signals. Further, in some instances, the output logic circuitry 112 may receive the single latched data signal (for one or more data bits) and then provide the single latched data signal (for one or more data bits) as one or more output signals 122. In some implementations, the multiple input signals 120 may include a data signal (D) and a write enable signal (WEN). However, in various other implementations, any number of input signals may be used, e.g., in the case of two or more input signals, any additional signals may be added with use of one or more AND gates for receiving the additional signals as inputs, such as, e.g., functional signal 132 and scan shift signal 126.

In some implementations, the clock circuitry 114 may be configured to provide one or more clock signals (CLKA, CLKB) to the first latch circuitry 104 and the second latch circuitry 106. The one or more clock signals (CLKA, CLKB) may include a first clock signal (CLKA) that may be used and/or applied as a scan shift signal 126 during a scan shift mode of operation. The multiple clock signals (CLKA, CLKB) may include a second clock signal (CLKB) that may be used and/or applied as a scan capture signal during a scan capture of inputs mode of operation. In some other implementations, the first clock signal (CLKA) and the second clock signal (CLKB) may be used together during a scan control (of outputs) mode of operation that utilizes the first clock signal (CLKA) to control a data output while the scan shift mode of operation is disabled. Further, in some instances, the first clock signal (CLKA) and the second clock signal (CLKB) may be used together during a functional mode of operation. These various modes of operation will be described in greater detail herein below in reference to FIGS. 2 and 3.

In some implementations, the scan shift signal 126 may be provided to the input logic circuitry 110, a design-for-test (DFT) signal 130 and a functional data signal 132 (F_Data Signal) may be provided to the intermediate logic circuitry 108, and a Q update signal 128 may be provided to the output logic circuitry 112. The functional data signal 132 (F_Data signal) may be implemented with a bit array signal. Also, a feedback signal (FBS) 134 may be provided from the second latch circuitry 106 to the input logic circuitry 110, and a scan output signal (Scan_0: SO[0]) 136 may be provided as an input signal to the output logic circuitry 112. Thus, in some instances, an output of the second latch circuitry 106 feeds the output logic circuitry 112, and it also feeds SO[0], i.e., the scan_0 signal 136. These various signals 126, 128, 130, 132, 134, 136 will be described in greater detail herein below in reference to FIGS. 2 and 3. In some implementations, the feedback signal (FBS) 134 may simply be referred to as a connection between the second latch circuitry 106 and the first latch circuitry 110, and in this instance, the FBS 134 may not be a conventional feedback signal, and instead, the FBS 134 may simply function as a connection between circuitry 106 and 110.

The memory circuitry 100 may be implemented as an integrated circuit (IC) for various types of scan chain applications. The memory circuitry 100 may be implemented as an IC with various dual and/or single rail memory architecture and related circuitry. Also, the memory circuitry 100 may be integrated with computing circuitry and related components on a single chip. In various implementations, the memory circuitry 100 may be implemented in embedded systems for electronic, mobile, IoT (Internet of things), automotive, and enterprise applications.

Figure 2:
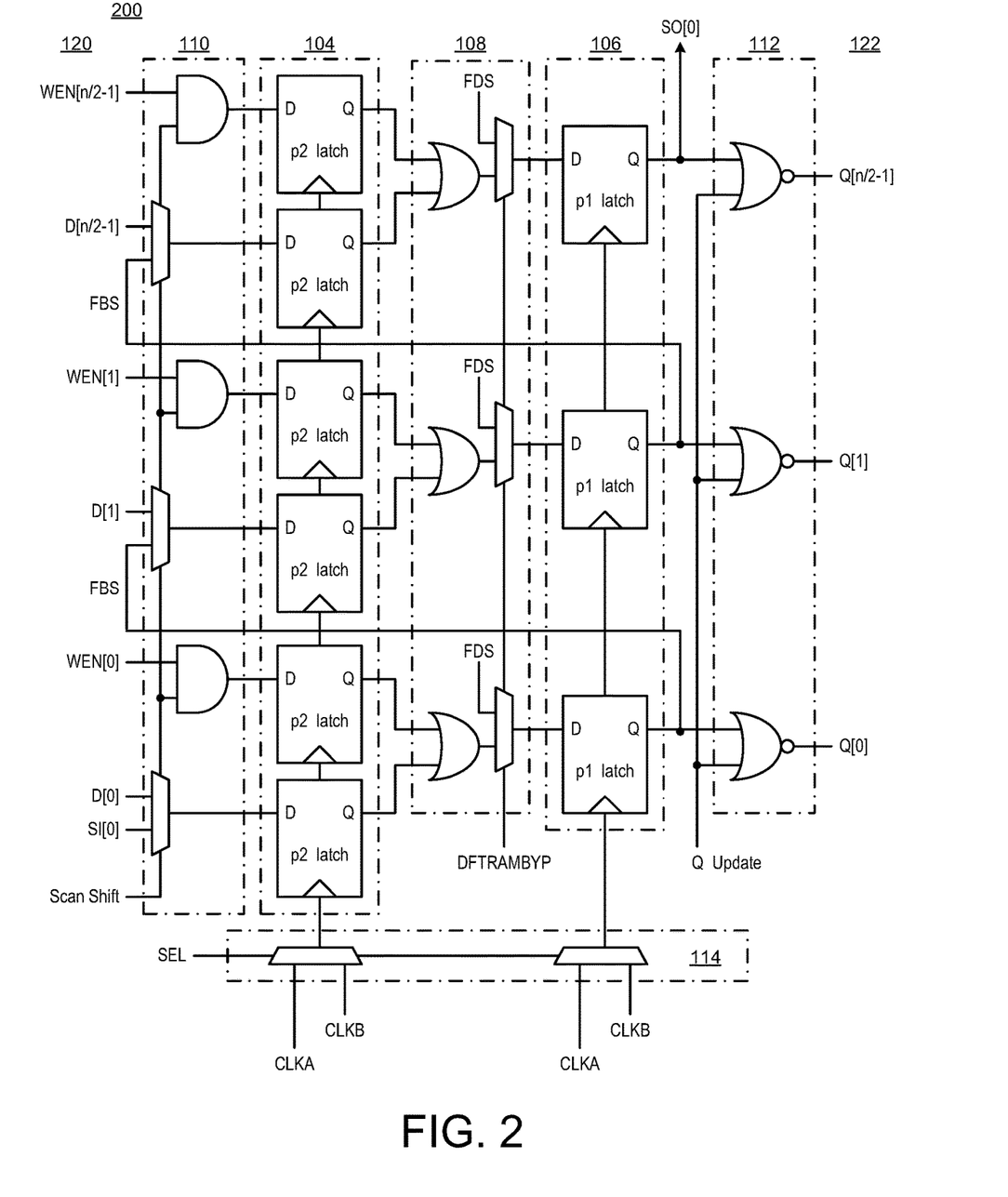
FIG. 2 illustrates a diagram of latch circuitry for memory applications for dual port applications in accordance with various implementations described herein.

FIG. 2 illustrates a diagram of memory circuitry 200 for dual port applications in accordance with various implementations described herein. In reference to FIG. 2, various components described therein are similar in scope and functionality to related components as shown and described in reference to FIG. 1. As described herein in reference to FIG. 2, multiple input signals (e.g., D and WEN) are merged into a single (1) scan chain. This may improve area from 4 latches/bit down to 3 latches/bit and from 2 scan chains to 1 scan chain. This may further improve the test quality due to including the input signal function (e.g., D or WEN) into the design-for-test (DFT) scan path. Various implementations described herein may use any input signals other than D and/or WEN.

As shown in FIG. 2, the first latch circuitry 104 includes multiple first latches (e.g., two p2_latches) per data bit that latch multiple input data signals 120, such as, e.g., data (D), write enable (WEN) per data bit, or any other type of signal. In some instances, the first latches (p2_latches) may be implemented with p1_latches. In other instances, the multiple first latches of the first latch circuitry 104 may be implemented with D flip-flops that are configured to capture an input value at a D-input at a definite portion of a clock cycle, such as, e.g., a rising edge of a clock or a falling edge of the clock, depending on various specific implementations.

Therefore, in some implementations, the multiple first latches of the first latch circuitry 104 may include two (2) latches (e.g., p2_latches) per data bit and operate in a first clock phase (e.g., negative clock phase; clock low latch), and the single second latch operates in a second clock phase that is different than the first clock phase (e.g., positive clock phase; clock high latch). However, in other implementations, the first latches of the first latch circuitry 104 may operate in the second clock phase (e.g., positive clock phase; clock high latch), and the single second latch may operate in the first clock phase that is different than the second clock phase (e.g., negative clock phase; clock low latch).

The second latch circuitry 106 may include a single second latch (e.g., a single or one p1_latch) per data bit that receives the latched multiple input data signals from the multiple first latches of the first latch circuitry 104 and outputs a single latched data signal per data bit based on the latched multiple input data signals. In some instances, each of the second latches (p1_latches) may be implemented with p2_latches. In other instances, the single second latch (p1_latch) of the second latch circuitry 106 may be implemented with a D flip-flop that is configured to capture an input value at the D-input at a definite portion of a clock (CLK) cycle, such as, e.g., a rising edge of a clock or a falling edge of the clock, depending on various specific implementations.

In some implementations, the p2_latch-to-p1_latch creates a positive edge flip-flop; however, in some instances, a negative edge flip-flop may be used. Thus, in some instances, the first latch circuitry 104 may use multiple p1_latches per data bit, and the second latch circuitry 106 may use a single p2_latch per data bit. In this instance, two p1 first latches and one p2 second latch may be used.

In some implementations, as shown in FIG. 2, the input logic circuitry 110 receives the multiple input data signals 120 per data bit including a first input data signal, such as, e.g., the data signal (D), and a second input data signal, such as, e.g., the write enable signal (WEN), that is different than the first input data signal. However, in various other implementations, any relevant signal that transitions similar to the data signal (D) and the write enable signal (WEN) may be used as the input data signals 120. Also, any number of input data signals may be used.

As shown in FIG. 2, the input logic circuitry 110 includes multiple logic gates per data bit including a first logic gate (e.g., an AND gate) and a second logic gate (e.g., a MUX). Thus, in some instances, the first logic gate may be implemented with an AND gate, and the second logic gate may be implemented with a first multiplexer (MUX). The first logic gate (AND) receives the write enable (WEN) signal and a scan shift signal, and the first logic gate (AND) provides a first data signal (D) to the first latches per data bit of the first latch circuitry 104. Further, the second logic gate (MUX) receives the input data signal (D) and the single latched data signal (Q) per data bit as a feedback or connection signal (FBS) from the single second latch per data bit of the second latch circuitry 106, and the second logic gate (MUX) provides a second data signal to the first latches per data bit of the first latch circuitry 104 based on the scan shift signal. In some instances, the feedback or connection signal (FBS) may be referred to as a latch-to-latch connection signal between latches. Also, the input logic circuitry 110 may include another multiplexer (MUX) that receives a data signal (e.g., D[0]) and a scan input signal (e.g., SI[0]) and provides an output signal based on the scan shift signal. Also, any number of logic gates may be used, such as, e.g., one or more AND gates.

As shown, the intermediate logic circuitry 108 may be coupled between the first latch circuitry 104 and the second latch circuitry 106. The intermediate logic circuitry 108 may receive and combine the multiple input data signals 120 per data bit from the first latch circuitry 104 into a single data signal that is provided to the single second latch per data bit of the second latch circuitry 106 for output as the single latched data signal per data bit. The intermediate logic circuitry 108 may include multiple logic gates per data bit including a third logic gate (e.g., an OR gate) and a fourth logic gate (e.g., a MUX). Thus, in some instances, the third logic gate may be implemented with an OR gate, and the fourth logic gate may be implemented with a second multiplexer (MUX). The third logic gate (OR) receives the multiple input data signals including output data (Q) signals from the two (2) latches of the first latches (of the first latch circuitry 104) and provides a logic output signal to the fourth logic gate (MUX). The fourth logic gate (MUX) receives multiple signals including the logic output signal from the third logic gate (OR) and a functional data signal (FDS), and the fourth logic gate (MUX) provides the single data signal to the single (1) second latch of the second latches (of the second latch circuitry 106) based on a design-for-test (DFT) signal (i.e., DFTRAMBYP). In some instances, DFTRAMBYP may refer to design-for-test (DFT) random access memory (RAM) bypass (BYP).

The output logic circuitry 112 may include at least one logic gate, such as, e.g., a fifth logic gate (e.g., NOR gate, NAND gate, and/or having one or more inverters) that receives one or more signals from the second latches including the single latched data signal per data bit of the second latch circuitry 106. Thus, in some instances, the fifth logic gate may be implemented with a NOR gate. However, in other instances, the fifth logic gate may be implemented with a NAND gate, one or more inverters, and/or some combination of similar logic gates. As shown, the output logic circuitry 112 may receive the output signal (Q), which may be provided as an input signal to the at least one NOR gate of the output logic circuitry 112. Thus, the Q output of the p1_latch feeds the output logic circuitry 112, and it also feeds SO[0]. Also, in some instances, the output logic circuitry 112 receives an update signal (e.g., Q_Update), and the output logic circuitry 112 provides one or more output (Q) signals based on the single latched data signal and the update signal (e.g., Q_Update).

In some implementations, as shown in FIG. 2, the clock circuitry 114 provides multiple clock signals (e.g., CLKA, CLKB) to the latches in the first latch circuitry 104 and the second latch circuitry 106. Thus, the multiple clock signals may include a first clock signal (CLKA) that may be used as a scan shift signal during a first mode of operation, and the multiple clock signals may include a second clock signal (CLKB) that may be used as a scan capture signal during a second mode of operation. In some instances, the clock circuitry 114 may include multiple multiplexors (e.g., 2) that receive the first and second clock signals (CLKA, CLKB) and provide an output clock signal to the latches in the first and second latch circuitry 104, 106 based on a selection signal (SEL). In some instance, the selection signal (SEL) may include one or more signals, such as, e.g., the scan enable signal (SE), the DFTQSHIFT signal, and/or possibly the DFTRAMBYP signal.

In some instances, the first clock signal (CLKA) and the second clock signal (CLKB) may be used together during a third mode of operation that uses the first clock signal (CLKA) to control a data output (e.g., Q) while the first mode of operation is disabled (i.e., shift enable is disabled and, e.g., this refers to a reason for using the DFTQSHIFT signal). In some instances, DFTQSHIFT may refer to a design-for-test Q shift of outputs, wherein Q refers to the outputs. Further, the first mode of operation may refer to a scan shift mode of operation, and the second mode of operation may refer to a scan capture (of inputs) mode of operation. Also, the third mode of operation may refer to a scan control (of outputs) during the capture mode of operation, and a fourth mode of operation may refer to a functional mode of operation that utilizes the first clock signal (CLKA) and the second clock signal (CLKB).

As shown in FIG. 2, the circuitry 200 may include any number (n) of rows of data bits with each data bit [0], [1], . . . [n/2−1] having corresponding input signals (i.e., D[0] & WEN[0], D[1] & WEN[1], . . . , D[n/2−1] & WEN[n/2−1]) and a corresponding output signal (i.e., Q[0], Q[1], . . . , Q[n/2−1]). As such, per data bit, each row of data bits includes two (2) latches in the first latch circuitry 104 that are coupled to a single (1) latch in the second latch circuitry 106 via the intermediate logic circuitry 108, which may also be referred to as transitional logic circuitry. Also, per data bit, the first latch circuitry 104 may include two (2) first latches (e.g., 2 latches) that receive and latch the input data signals 120, and the first latches operate in a first clock phase. Also, per data bit, the second latch circuitry 106 may include a single (1) second latch (e.g., 1 latch) that receives the latched input data signals from the first latches (e.g., 2 latches of the first latch circuitry 104) and outputs a single latched data signal based on the latched input data signals. The single second latch (e.g., 1 latch of the second latch circuitry 106) operates in a second clock phase that is different than the first clock phase. Also, per data bit, the intermediate (or transitional) logic circuitry 108 may be coupled between the first latch circuitry 104 and the second latch circuitry 106, such that the intermediate (or transitional) logic circuitry 108 receives and combines the input data signals from the first latch circuitry 104 into a single data signal that is provided to the single second latch of the second latch circuitry 106 for output as the single latched data signal.

In scan shift mode, the architecture and/or structure of the memory circuitry 200 allows for full capture of data signals, wherein shifting allows data to be put in latches that may be shifted out or shifted through. Also, the clocking of the memory circuitry 200 enables full testability features during scan mode. In this instance, the first latches (e.g., 2 negative phase and 2 latches per data bit, clock low latch, for each D and WEN latch pair) of the first latch circuitry 104 are configured to latch multiple input data signals (e.g., clock low data in, read/write control signal transaction capture, clock high data output, latches on high signal). The second latches (1 positive phase, 1 share clock high latch, for each D and WEN latch pair) of the second latch circuitry 106 are configured to output a (single) latched data signal based on the latched multiple input data signals. Further, the intermediate logic circuitry 108 is configured to enable capture of the multiple input data signals with a common input configuration.

In some schemes and techniques, the input signals D, WEN, and output signals Q may be implemented in three separate scan chains. However, in the schemes and techniques described herein, the input signals D, WEN, and Q are merged into a single (1) scan chain. In some instances, this improves area from 6 latches/bit down to 3 latches/bit and from 3 scan chains to 1 scan chain. This may improve test quality due to including the (D or WEN) function into the DFT scan path. This DFT design may support both synchronous and asynchronous read-clock and write-clock with one schematic design.

Below is a truth table (Table 1) with controlling pins, wherein:

DFTASYNC=>1 may be used for asynchronous clock design; and

DFTQSHIFT=>1 may be used for updating or launching new Q outputs during capture cycles. Note that the scan chain may have the ability to shift at functional speed to support at-speed capture in the external read logic.

TABLE 1

| CLKA | CLKB | DFTRAMBYP | DFTASYNC | SE | DFTQSHIFT | MODE |
|---|---|---|---|---|---|---|
| X |   | 1 | 0 | 0 | X (not used) | Capture from D/WEN, Launch to Qs (synchronous clock, or CLKB) |
|   | X | 1 | X | 1 | X | SHIFT, (Launch Qs) (CLKA) |
|   | X | 1 | 1 | 0 | 1 | SHIFT, (Launch Qs) (CLKA) |
| X |   | 1 | 1 | 0 | 0 | Capture D/WENs (CLKB) |
|   |   | 0 | X | 0 | X | Functional Mode |

In various implementations, the schemes and techniques described herein provide for combining Write_mask and Din for scan capture. Din/Q may be combined into a single flip-flop during scan mode, and this may be achieved with additional DFT clock control, e.g., by using only one of the clocks to shift. In some instances, asynchronous clocks on the write/read sides may be managed during test to maximize coverage and eliminate x-propagation during test. DFTASYNCH and/or DFTQSHIFT may be used to control behaviors. For instance, DFTASYNCH may be used to enable Q to have a static output during capture because write clock is used, and in some instances, DFTASYNC with DFTQSHIFT allows the output Q at-speed transitions to be launched to external logic based on Read clock during capture cycles.

Figure 3:
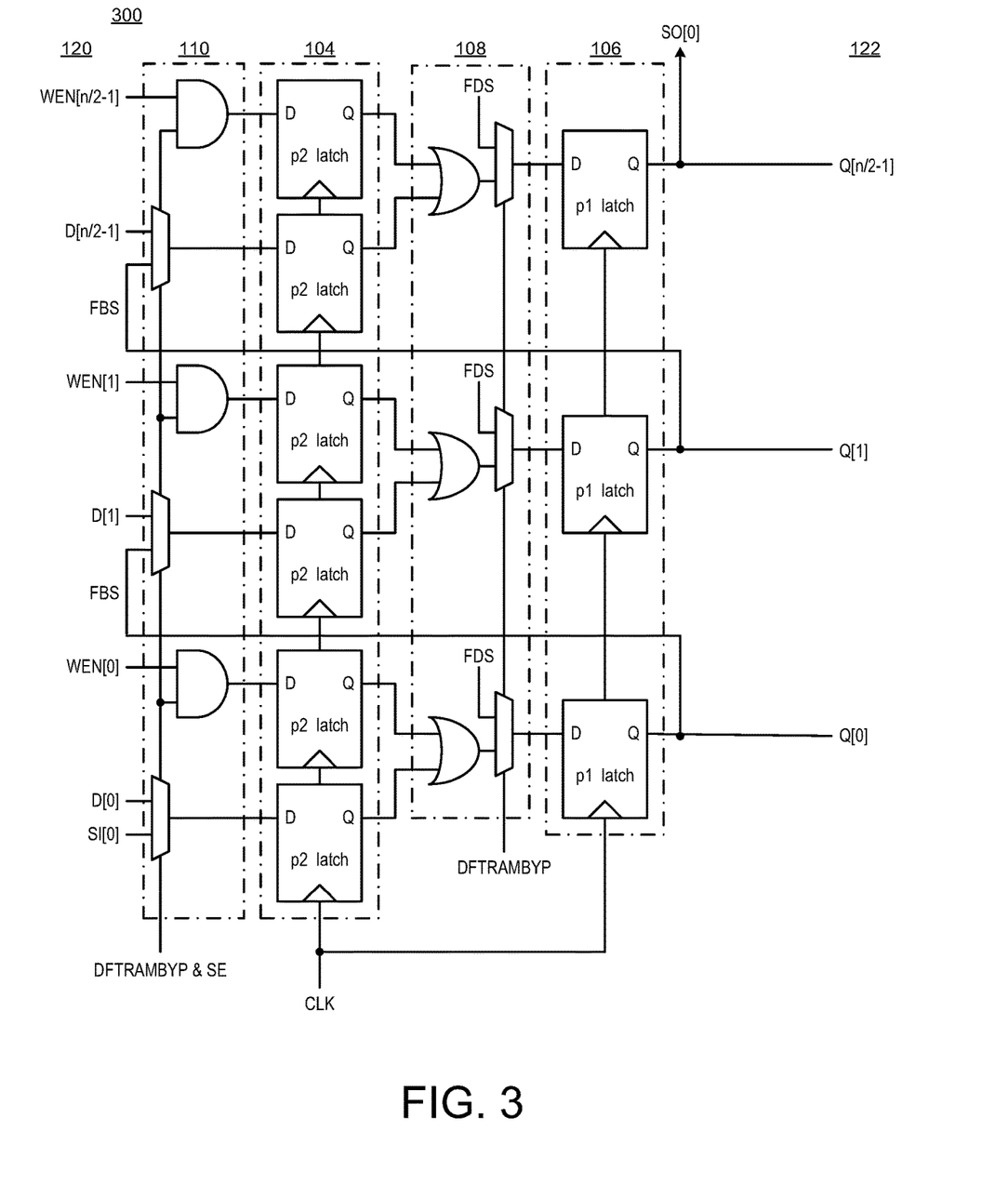
FIG. 3 illustrates a diagram of latch circuitry for memory applications for single port applications in accordance with various implementations described herein.

FIG. 3 illustrates a diagram of memory circuitry 300 for single port applications in accordance with implementations described herein. In reference to FIG. 3, various components described therein are similar in scope and functionality to related components as shown and described in reference to FIGS. 1 and 2.

As shown in FIG. 2, the first latch circuitry 104, the second latch circuitry 106, and the intermediate logic circuitry 108 are similar to the same as described in reference to FIG. 2. Also, the input logic circuitry 120 is similar to the same as described in reference to FIG. 2, except that the scan shift signal is replaced with the DFTRAMBYP and/or a scan enable signal (SE). As shown, the second logic gate (MUX) of the input logic circuitry 110 receives the input data signal (D) and the single latched data signal (Q) per data bit as a feedback or connection signal (FBS) from the single second latch per data bit of the second latch circuitry 106, and the second logic gate (MUX) provides a second data signal to the first latches per data bit of the first latch circuitry 104 based on the DFTRAMBYP and/or a scan enable signal (SE) (instead of the scan shift signal, as descried in reference to FIG. 2). Also, the input logic circuitry 110 may include another multiplexer (MUX) that receives a data signal (e.g., D[0]) and a scan input signal (e.g., SI[0]) and provides an output signal based on the DFTRAMBYP and/or a scan enable signal (SE) (instead of the scan shift signal, as described in reference to FIG. 2).

Also, as shown in FIG. 3, the memory circuitry 300 may not use the output circuitry 112 as described in FIG. 2, wherein the corresponding output signals (i.e., Q[0], Q[1], . . . , Q[n/2−1]) are provided directly from the single second latches of the second latch circuitry 106. Further, as also shown in FIG. 3, the memory circuitry 300 may not use the clock circuitry 112 as described in FIG. 2, wherein a single clock signal (CLK) is provided to the latches in the first latch circuitry 104 and the second latch circuitry 106. Therefore, the scope and operation of the circuitry 300 in FIG. 3 is similar to the scope and operation of the circuitry 200 in FIG. 2, except for the reduced number of clock signals (e.g., dual clock signals down to a single clock signal), less need for clock circuitry 114, and less need for output circuitry 112.

Figure 4:
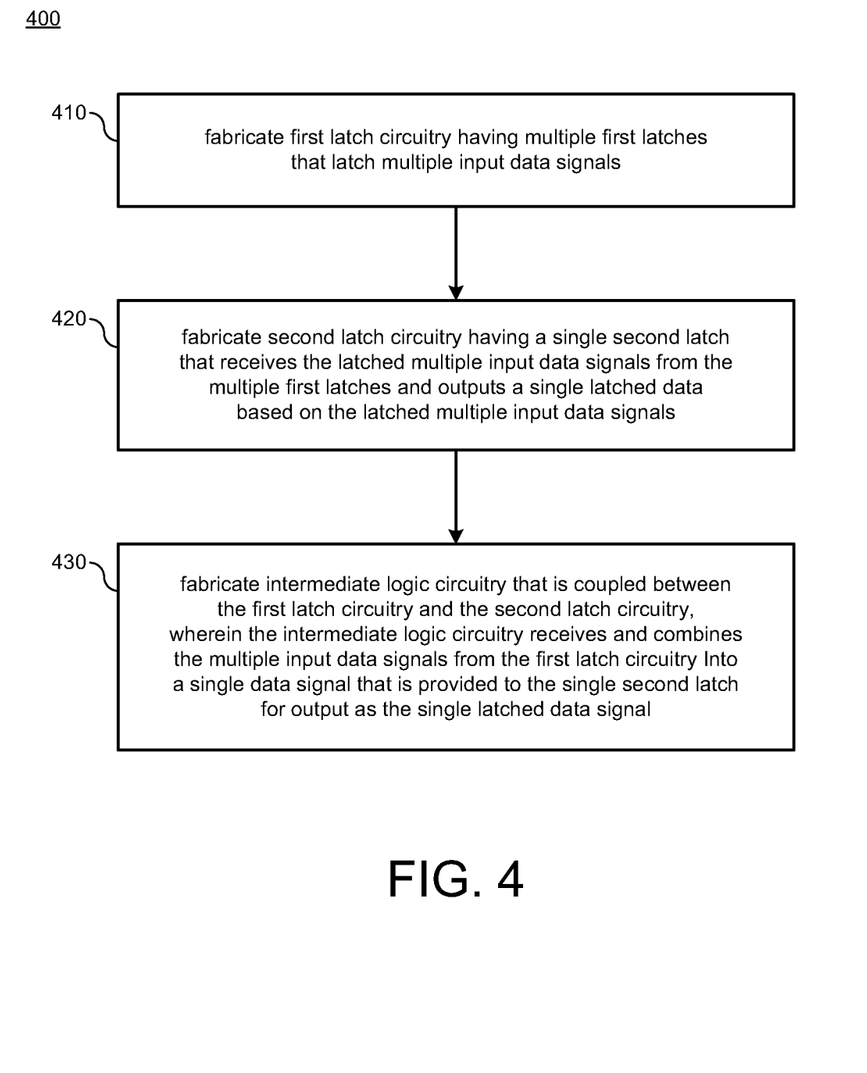
FIG. 4 illustrates a process flow diagram of a method for manufacturing an integrated circuit in accordance with various implementations described herein.

FIG. 4 illustrates a process flow diagram of a method 400 for manufacturing an integrated circuit in accordance with various implementations described herein.

It should be understood that even though method 400 may indicate a particular order of operation execution, various certain portions of operations may be executed in a different order, and on different systems. Also, additional operations and/or steps may be added to and/or omitted from method 400. In various implementations, method 400 may be implemented in hardware and/or software. For instance, if implemented in hardware, method 400 may be implemented with various circuit components, as described herein in reference to FIGS. 1-3. Otherwise, if implemented in software, method 400 may be implemented as a program and/or software instruction process that is configured for area efficient memory circuitry for various scan chain applications. Also, if implemented in software, instructions related to method 400 may be stored in non-transitory memory and/or a database. For instance, a computer or various other types of computing devices having a processor and memory may be configured to perform method 400.

As described and shown in reference to FIG. 4, method 400 may be used for manufacturing an integrated circuit (IC) that implements area efficient memory circuitry in various types of scan chain applications. In some instances, the integrated circuit (IC) may be implemented with SRAM for scan chain applications.

At block 410, method 400 may fabricate first latch circuitry having multiple first latches that latch multiple input data signals. The multiple first latches may include two (2) or more latches per data bit and operate in a first clock phase (e.g., negative clock phase; clock low latch), and the single second latch operates in a second clock phase that is different than the first clock phase (e.g., positive clock phase; clock high latch). In some instances, the multiple first latches of the first latch circuitry may be implemented with two (2) p2 type latches per data bit.

At block 420, method 400 may fabricate second latch circuitry having a single second latch that receives the latched multiple input data signals from the multiple first latches and outputs a single latched data signal based on the latched multiple input data signals. In some instances, the single second latch of the second latch circuitry may be implemented with one (1) p1 type latch per data bit.

At block 430, method 400 may fabricate intermediate logic circuitry that is coupled between the first latch circuitry and the second latch circuitry. The intermediate logic circuitry receives and combines the multiple input data signals from the first latch circuitry into a single data signal that is provided to the single second latch of the second latch circuitry for output as the single latched data. The intermediate logic circuitry may include multiple logic gates per data bit including a third logic gate (e.g., OR gate) and a fourth logic gate (e.g., MUX). The third logic gate (OR) receives the multiple input data signals including output data (Q) signals from the two (2) latches of the first latches and provides a logic output signal to the fourth logic gate (MUX). The fourth logic gate (MUX) receives multiple signals including the logic output signal from the third logic gate (OR) and a functional data signal (e.g., F_Data), and the fourth logic gate (MUX) provides the single data signal to the single (1) second latch of the second latches based on a design for test (DFT) signal (i.e., DFTRAMBYP).

In some implementations, method 400 may further fabricate input logic circuitry that receives the multiple input data signals per data bit including a first input data signal (e.g., D) and a second input data signal (e.g., WEN) that is different than the first input data signal. The input logic circuitry may include multiple logic gates per data bit including a first logic gate (e.g., AND gate) and a second logic gate (e.g., MUX). The first logic gate (AND) may receive a write enable (WEN) signal and a scan shift signal and provides a first data signal to the first latches per data bit. The second logic gate (MUX) receives an input data (D) signal and a single latched data (Q) signal per data bit from the single second latch per data bit and provides a second data signal to the first latches per data bit based on the scan shift signal.

In some implementations, method 400 may further fabricate output logic circuitry having at least one logic gate including a fifth logic gate (e.g., NOR gate, NAND gate, or one or more inverters) that receives one or more signals from the second latches including the single latched data signal per data bit. The output logic circuitry receives an update signal (e.g., Q_Update), and the output logic circuitry provides one or more scan output (Q) signals based on the single latched data signal and the update signal.

In some implementations, method 400 may further fabricate clock circuitry that provides multiple clock signals (e.g., CLKA, CLKB) to the first latch circuitry and the second latch circuitry. The multiple clock signals may include a first clock signal (CLKA) that is used as a scan shift signal during a first mode of operation, and the multiple clock signals may include a second clock signal (CLKB) that is used as a scan capture signal during a second mode of operation. The first clock signal (CLKA) may be used during a third mode of operation that uses the first clock signal (CLKA) to control a data output while the first mode of operation is disabled (i.e., shift enable is disabled, e.g., this is the reason for DFTQSHIFT).

In some implementations, the first mode of operation refers to a scan shift mode of operation, and the second mode of operation refers to a scan capture (of inputs) mode of operation. Further, the third mode of operation refers to a scan control (of outputs) during the capture mode of operation, and a fourth mode of operation refers to a functional mode of operation that uses the first and second clock signals (CLKA, CLKB).

Described herein are various implementations of an integrated circuit. The integrated circuit may include first latch circuitry having multiple first latches per data bit that latch multiple input data signals per data bit. The integrated circuit may include second latch circuitry having a single second latch per data bit that receives the latched multiple input data signals from the multiple first latches and outputs a single latched data signal per data bit based on the latched multiple input data signals. The integrated circuit may include intermediate logic circuitry that is coupled between the first latch circuitry and the second latch circuitry. The intermediate logic circuitry may receive and combine the multiple input data signals per data bit from the first latch circuitry into a single data signal that is provided to the single second latch per data bit of the second latch circuitry for output as the single latched data signal per data bit.

Described herein are various implementations of an integrated circuit. The integrated circuit may include first latch circuitry having first latches that receive and latch input data signals, wherein the first latches operate in a first clock phase. The integrated circuit may include second latch circuitry having a single second latch that receives the latched input data signals from the first latches and outputs a single latched data signal based on the latched input data signals. The single second latch may operate in a second clock phase that is different than the first clock phase. The integrated circuit may include transitional logic circuitry coupled between the first latch circuitry and the second latch circuitry. The transitional logic circuitry may receive and combine the input data signals from the first latch circuitry into a single data signal that is provided to the single second latch for output as the single latched data signal.

Described herein are various implementations of an integrated circuit. The integrated circuit may include first latch circuitry that latches multiple input data signals. The integrated circuit may include second latch circuitry that receives the latched multiple input data signals from the first latch circuitry and outputs a single latched data signal based on the latched multiple input data signals. The integrated circuit may include logic circuitry that is coupled between the first latch circuitry and the second latch circuitry. The logic circuitry may receive and combine the multiple input data signals from the first latch circuitry into a single data signal that is provided to the second latch circuitry for output as the single latched data signal. The integrated circuit may include clock circuitry that provides one or more clock signals to the first latch circuitry and the second latch circuitry. The one or more clock signals may include a first clock signal that is used as a scan shift signal during a scan shift mode of operation, and the multiple clock signals may include a second clock signal that is used as a scan capture signal during a scan capture of inputs mode of operation.

The above referenced summary section is provided to introduce a selection of concepts in a simplified form that are further described above in the detailed description section. The summary is not intended to identify key features or essential features of the claimed subject matter, nor is it intended to be used to limit the scope of the claimed subject matter. Moreover, the claimed subject matter is not limited to implementations that solve any or all disadvantages noted in any part of this disclosure.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    first latch circuitry having multiple first latches per data bit that latch multiple input data signals per data bit;
    second latch circuitry having a single second latch per data bit that receives the latched multiple input data signals from the multiple first latches and outputs a single latched data signal per data bit; and
    intermediate logic circuitry that is coupled between the first latch circuitry and the second latch circuitry, wherein the intermediate logic circuitry receives the multiple input data signals per data bit from the first latch circuitry and generates a single data signal that is provided to the single second latch per data bit of the second latch circuitry for output as the single latched data signal per data bit.

2. The integrated circuit of claim 1, wherein the integrated circuit comprises static random access memory (SRAM) having a scan chain.

3. The integrated circuit of claim 1, wherein the multiple first latches comprise two latches per data bit and operate in a first clock phase, and wherein the single second latch operates in a second clock phase that is different than the first clock phase.

4. The integrated circuit of claim 1, further comprising input logic circuitry that receives the multiple input data signals per data bit including a first input data signal and a second input data signal that is different than the first input data signal.

5. The integrated circuit of claim 4, wherein the input logic circuitry comprises multiple logic gates per data bit having a first logic gate and a second logic gate, and wherein the first logic gate receives a write enable signal and a scan shift signal and provides a first data signal to the first latches per data bit, and wherein the second logic gate receives the input data signal and the single latched data signal per data bit from the single second latch per data bit and provides a second data signal to the first latches per data bit based on the scan shift signal.

6. The integrated circuit of claim 5, wherein the first logic gate comprises an AND gate, and wherein the second logic gate comprises a first multiplexer (MUX).

7. The integrated circuit of claim 1, wherein the intermediate logic circuitry comprises multiple logic gates per data bit having a third logic gate and a fourth logic gate.

8. The integrated circuit of claim 7, wherein the third logic gate receives the multiple input data signals having output data signals from the two (2) or more latches of the first latches and provides a logic output signal to the fourth logic gate, and wherein the fourth logic gate receives multiple signals having the logic output signal from the third logic gate and a functional data signal, and wherein the fourth logic gate provides the single data signal to the single second latch of the second latches based on a design-for-test (DFT) signal.

9. The integrated circuit of claim 7, wherein the third logic gate comprises an OR gate, and wherein the fourth logic gate comprises a second multiplexer (MUX).

10. The integrated circuit of claim 1, further comprising output logic circuitry having at least one logic gate having a fifth logic gate that receives one or more signals from the second latches having the single latched data signal per data bit, and wherein the output logic circuitry receives an update signal, and wherein the output logic circuitry provides one or more scan output signals based on the single latched data signal and the update signal.

11. The integrated circuit of claim 10, wherein the fifth logic gate comprises a NOR gate or a NAND gate.

12. The integrated circuit of claim 1, further comprising clock circuitry that provides multiple clock signals to the first latch circuitry and the second latch circuitry, wherein the multiple clock signals include a first clock signal that is used as a scan shift signal during a first mode of operation, and wherein the multiple clock signals include a second clock signal that is used as a scan capture signal during a second mode of operation, and wherein the first clock signal is used during a third mode of operation that uses the first clock signal to control a data output while the first mode of operation is disabled.

13. The integrated circuit of claim 12, wherein the first mode of operation refers to a scan shift mode of operation, and wherein the second mode of operation refers to a scan capture of inputs mode of operation, and wherein the third mode of operation refers to a scan control of outputs during the capture mode of operation, and wherein a fourth mode of operation refers to a functional mode of operation that uses the first clock signal and the second clock signal.

14. An integrated circuit, comprising:
first latch circuitry having first latches that receive and latch input data signals, wherein the first latches operate in a first clock phase;
second latch circuitry having a single second latch that receives the latched input data signals from the first latches and outputs a single latched data signal, wherein the single second latch operates in a second clock phase that is different than the first clock phase; and
transitional logic circuitry coupled between the first latch circuitry and the second latch circuitry, wherein the transitional logic circuitry receives the input data signals from the first latch circuitry and generates a single data signal that is provided to the single second latch for output as the single latched data signal.

15. The integrated circuit of claim 14, further comprising input logic circuitry that receives the input data signals including a first input data signal and a second input data signal that is different than the first input data signal.

16. The integrated circuit of claim 15, wherein the input logic circuitry comprises multiple logic gates having a first logic gate and a second logic gate, and wherein the first logic gate comprises an AND gate, and wherein the second logic gate comprises a first multiplexer (MUX).

17. The integrated circuit of claim 14, wherein the intermediate logic circuitry comprises multiple logic gates having a third logic gate and a fourth logic gate, and wherein the third logic gate comprises an OR gate, and wherein the fourth logic gate comprises a second multiplexer (MUX).

18. The integrated circuit of claim 14, further comprising output logic circuitry having at least one logic gate including a fifth logic gate, and wherein the fifth logic gate comprises a NOR gate or a NAND gate.

\* \* \* \* \*